US009530355B2

(12) United States Patent
Sun

(10) Patent No.: US 9,530,355 B2
(45) Date of Patent: Dec. 27, 2016

(54) SHIFT REGISTER AND DRIVING METHOD THEREOF, SHIFT SCANNING CIRCUIT AND DISPLAY APPARATUS

(71) Applicant: BOE TECHNOLOGY GROUP CO., LTD., Beijing (CN)

(72) Inventor: Tuo Sun, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/888,776

(22) PCT Filed: May 15, 2015

(86) PCT No.: PCT/CN2015/079127
§ 371 (c)(1),
(2) Date: Nov. 3, 2015

(87) PCT Pub. No.: WO2016/090849
PCT Pub. Date: Jun. 16, 2016

(65) Prior Publication Data
US 2016/0189626 A1 Jun. 30, 2016

(30) Foreign Application Priority Data

Dec. 10, 2014 (CN) .......................... 2014 1 0759198

(51) Int. Cl.
G09G 3/32 (2016.01)
G11C 19/28 (2006.01)
(52) U.S. Cl.
CPC .......... *G09G 3/3266* (2013.01); *G09G 3/3225* (2013.01); *G11C 19/28* (2013.01);
(Continued)
(58) Field of Classification Search
CPC combination set(s) only.
See application file for complete search history.

(56) References Cited

U.S. PATENT DOCUMENTS 9,257,198 B2 * 2/2016 Yan ........................ G11C 19/28
2006/0269038 A1 11/2006 Jang et al.
2013/0136224 A1 * 5/2013 Qing ...................... G11C 19/28
377/64

FOREIGN PATENT DOCUMENTS

CN 102654968 A 9/2012
CN 103236272 A 8/2013
(Continued)

OTHER PUBLICATIONS

Search Report and Written Opinion Mailed Aug. 17, 2015 from State Intellectual Property Office of the P.R. China.

*Primary Examiner* — Van Chow
(74) *Attorney, Agent, or Firm* — Dilworth & Barrese, LLP.

(57) ABSTRACT

Provided are a shift register and a driving method thereof, a shift scanning circuit, and a display apparatus. The shift register comprises an input switch unit, an inverting unit, an output switch unit, and a first node voltage maintaining unit. The input switch unit has an output terminal (O) connected to a first node (N1). The first node voltage maintaining unit has a voltage stabilizing terminal connected to the first node (N1), and is adapted to record a level at the first node (N1) when the input switch unit is turned on, and to maintain the recorded level at an input terminal (I) of the inverting unit when the input switch unit is turned off. The inverting unit has an output terminal (O) connected to a second node (N2). The output switch unit has a control terminal (CON) connected to the second node (N2), and is turned on according to a state of a level at the second node. The shift register provided by the solution can adopt a PMOS structure to realize shifting positive-logic scanning signals and outputting positive-logic scanning signals, so that the PMOS structure can be used for the scan driving of the LTPS AMOLED.

20 Claims, 4 Drawing Sheets

(52) U.S. Cl.
CPC ............ *G09G 2300/0871* (2013.01); *G09G 2310/0286* (2013.01); *G09G 2310/08* (2013.01)

(56) References Cited

FOREIGN PATENT DOCUMENTS

| | | |
|---|---|---|
| CN | 104021769 A | 9/2014 |
| CN | 104064153 A | 9/2014 |
| CN | 104091573 A | 10/2014 |
| CN | 104409045 A | 3/2015 |
| CN | 204257175 U | 4/2015 |

\* cited by examiner

SHIFT REGISTER AND DRIVING METHOD THEREOF, SHIFT SCANNING CIRCUIT AND DISPLAY APPARATUS

FIELD OF THE DISCLOSURE

The present disclosure relates to a shift register and a driving method thereof, a shift scanning circuit, and a display apparatus.

BACKGROUND

The organic light-emitting diode (OLED), as a current-type light-emitting device, has been used more and more in the field of high performance display, due to its characteristics such as self light emitting, fast response, wide angle of view, and capability of being manufactured on a flexible substrate. OLED display apparatuses can be classified into two types, PMOLED (Passive Matrix Driving OLED) and AMOLED (Active Matrix Driving OLED). An AMOLED display is expected to replace LCD (liquid crystal display) as the next generation of new type of flat panel display due to its advantages such as low manufacturing cost, high speed of response, power saving, capability of being used for DC driving of a portable device, and a wide range of operating temperature. Therefore, an AMOLED display panel with an embedded touch control function has been favored by more and more people.

A LTPS AMOLED (Low Temperature Poly-silicon AMOLED) generally employs positive pluses for driving pixels. In general, a shift register in the technologies known by the inventor directly shifts and outputs input signals. However, PMOS (positive channel Metal Oxide Semiconductor) is generally used for outputting negative logic (negative pulse signals), so if the shift register in the technologies known by the inventor adopts a PMOS structure, then it can not output positive logic (positive pulse signals), and can not be applied in the LTPS AMOLED.

SUMMARY

An embodiment of the disclosure provides a shift register comprising an input switch unit, an inverting unit, an output switch unit, and a first node voltage maintaining unit, wherein the input switch unit has an output terminal connected to a first node, and is turned on according to a control signal applied on its control terminal; the first node voltage maintaining unit has a voltage stabilizing terminal connected to the first node, and is adapted to record a level at the first node when the input switch unit is turned on, and to maintain the recorded level at an input terminal of the inverting unit when the input switch unit is turned off; the inverting unit has an output terminal connected to a second node, and is adapted to make the level at the first node inverted and output to the second node, in response to the control signal input at its control terminal; the output switch unit has a control terminal connected to the second node, and is turned on according to a state of a level at the second node.

Further, it comprises a leakage protection switch unit, wherein the leakage protection switch unit has an input terminal connected to an output terminal of the output switch unit and a control terminal connected to the first node, and is turned on according to a state of the level at the first node.

Further, it comprises a first lock switch unit and a second lock switch unit, the first lock switch unit and the second lock switch unit being turned on according to states of levels at their control terminals, wherein the first lock switch unit has an output terminal connected to an input terminal of the second lock switch unit and an control terminal connected to the second node, and the second lock switch unit has an output terminal connected to the first node.

Further, it comprises a second node voltage maintaining unit, wherein the second node voltage maintaining unit has a voltage stabilizing terminal connected to the second node, and is adapted to record the level at the first node when the inverting unit is operating, and to maintain the recorded level at the second node when the inverting unit stops operating.

Further, the inverting unit comprises a first inverting switch unit, a second inverting switch unit, a third inverting switch unit, and a third node voltage maintaining unit, wherein the respective inverting switch units are all turned on according to states of levels at their control terminals, and the control terminal of the inverting units is a control terminal of the first inverting switch unit; and wherein an output terminal of the first inverting switch unit and a control terminal of the second inverting switch unit are connected to a third node, an output terminal of the second inverting switch unit is connected to an input terminal of the third inverting switch unit and the second node, and an output terminal of the third inverting switch unit is connected to the first node; and wherein the third node voltage maintaining unit has a voltage stabilizing terminal connected to the third node, and is adapted to record a level at the third node when the first inverting switch unit is turned on, and to maintain the recorded level at the third node when the first inverting switch unit is turned off.

Further, the inverting unit comprises a first inverting switch unit, a second inverting switch unit, a third inverting switch unit, and a fourth inverting switch unit, wherein the respective inverting switch units are all turned on according to states of levels at their control terminals, and the control terminal of the inverting units is a control terminal of the first inverting switch unit; and wherein an output terminal of the first inverting switch unit, a control terminal of the second inverting switch unit and an input terminal of the fourth inverting switch unit are connected to a third node, an output terminal of the second inverting switch unit is connected to an input terminal of the third inverting switch unit and the second node, and an output terminal of the third inverting switch unit is connected to the first node.

Further, the respective switch units are all P-channel type transistors and voltage stabilizing units are capacitors.

The disclosure also provides a shift scanning circuit comprising a plurality of cascaded shift registers according to any one of the above.

Further, it comprises at least one clock signal line, wherein, in respective shift registers, the control terminals of the input switch units are connected to the same clock signal line, and the input terminals of the output switch units are connected to the same clock signal line, and the input terminal of the input switch unit in the present-stage shift register is connected to the output terminal in a previous-stage shift register.

Further, when inverting units comprises a first inverting switch unit, a second inverting switch unit, a third inverting switch unit and a third node voltage maintaining unit, the control terminals of the first inverting switch units in the respective shift registers are connected to the same clock signal line, and the clock signal line is different from the one connected to the control terminals of the input switch units.

Further, when the inverting unit comprises a first inverting switch unit, a second inverting switch unit, a third inverting switch unit and a fourth inverting switch unit, the control terminal of the first inverting switch unit in the present-stage shift register is connected to an output terminal in the previous-stage shift register, and an input terminal is connected to the second node in the previous-stage shift register.

Further, when the respective shift registers comprise first lock switch units and second lock switch units, control terminals of the second lock switch units in the respective shift registers are connected to the same clock signal line, and the clock signal line is different from the one connected to the control terminals of the input switch units.

Further, the clock signal line connected to the input terminals of the output switch units is the same with the one connected to the control terminals of the input switch units.

An embodiment of the disclosure also provides a driving method of a shift register, for driving the shift register according to any one of the above, the method comprising: applying a control signal on a control terminal of an input switch unit so that the input switch unit is turned on during a first clock period and is turned off during a second clock period, wherein the first clock period is a clock period during which a high level signal is input to the input terminal of the input switch unit; applying a control signal on a control terminal of an inverting unit so that the inverting unit makes a voltage at the first node inverted and output to the second node during the first clock period and the second clock period; and applying a high level signal on an input terminal of an output switch unit during one clock period of the first clock period and the second clock period, and applying a low level signal during the other clock period.

An embodiment of the disclosure also provides a display apparatus comprising the shift scanning circuit according to any one of the above.

The shift register provided by the embodiments of the disclosure can adopt a PMOS structure to realize shifting positive-logic scanning signals and outputting positive-logic scanning signals, so that the PMOS structure can be used for the scan driving of the LTPS AMOLED.

DETAILED DESCRIPTION

In the following, the implementations of the disclosure are further described in details in connection with the accompanying drawings and embodiments. The following embodiments are used for illustrating the disclosure, but not for limiting the scope of the disclosure.

Figure 1:
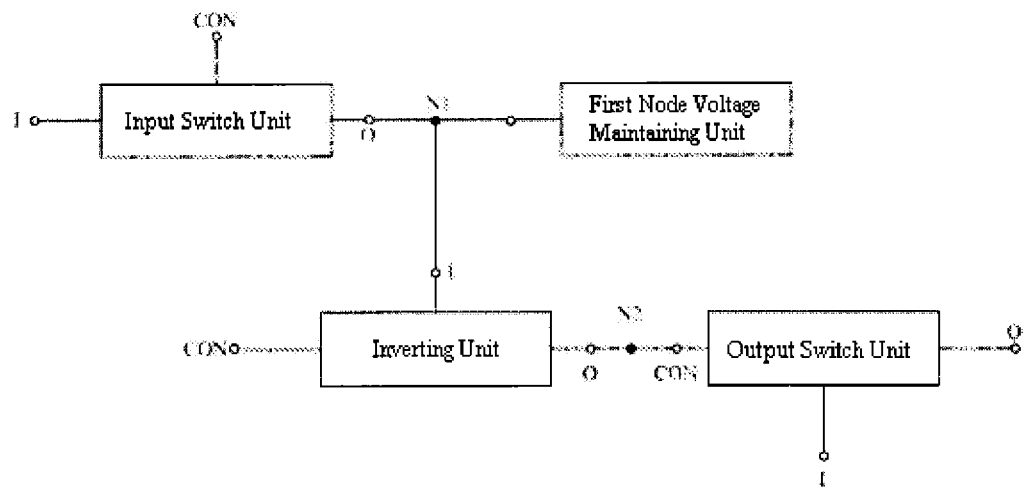
FIG. 1 is a structure schematic diagram of a shift register provided by an embodiment of the disclosure.

An embodiment of the disclosure provides a shift register, as shown in FIG. 1, comprising an input switch unit, an inverting unit, an output switch unit and a first node voltage maintaining unit. To facilitate explanation, the input terminals of the respective units in the figure are represented as I, the output terminals are represented as O, and the control terminals are represented as CON. The input switch unit has an output terminal connected to a first node N1, and is turned on according to a control signal applied on its control terminal. The first node voltage maintaining unit has a voltage stabilizing terminal connected to the first node N1, and is adapted to record a level at the first node when the input switch unit is turned on and to maintain the recorded level at an input of the inverting unit when the input switch unit is turned off. The inverting unit has an output terminal connected to a second node, and is adapted to make the level at the first node inverted and output to the second node N2, in response to the control signal input at its control terminal N1. The output switch unit has a control terminal connected to the second node N1, and is turned on according to a state of a level at the second node N1.

An embodiment of the disclosure also provides a method which can be used for driving the above shift register. The method comprises: applying a control signal on the control terminal of the input switch unit so that the input switch unit is turned on during a first clock period and a third clock period and is turned off during a second clock period, wherein the first clock period is a clock period during which a high level signal is input to the input terminal of the input switch unit; applying a control signal on the control terminal of the inverting unit so that the inverting unit makes a voltage at the first node inverted and output to the second node during the first clock period and the second clock period, and stops operating during the third clock period; and applying a high level on the input terminal of the output switch unit during one of the first clock period and the second clock period, and applying a low level during the other clock period.

The shift register and the driving method thereof provided by the embodiments of the disclosure can make the shift register with a PMOS structure shift positive-logic scanning signals and output positive-logic scanning signals. In the following, the operating principle of the shift register provided by the embodiments of the disclosure is described in connection with some implementing structures and driving methods.

Figure 2:
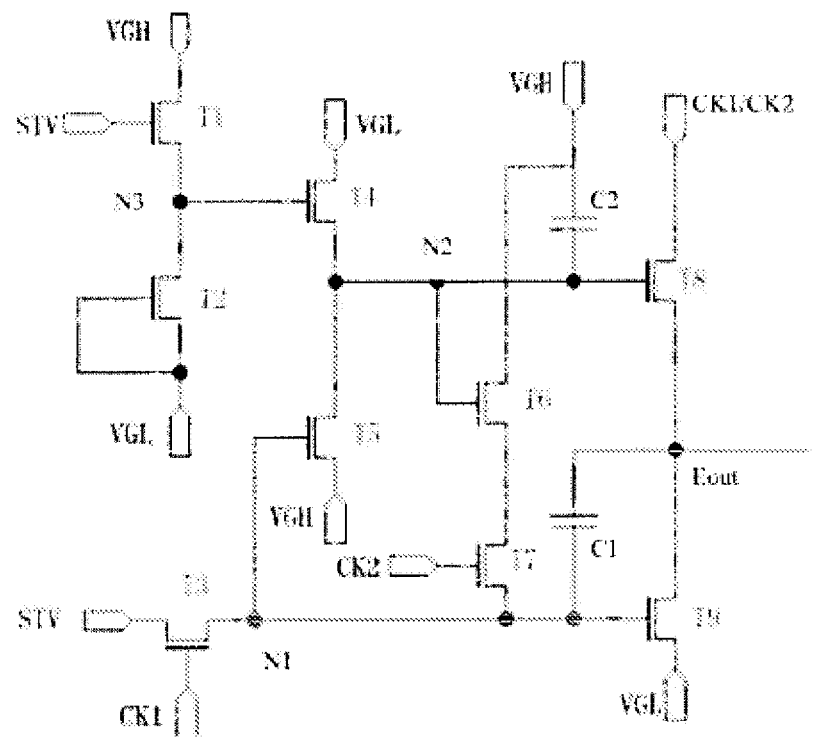
FIG. 2 is a structure schematic diagram of an optional structure of the shift register in FIG. 1.

FIG. 2 is a structure schematic diagram of an optional structure of the shift register in FIG. 1, comprising 9 PMOS transistors and 2 capacitors, C1 and C2. A drain of a first transistor T1, a source of a second transistor T2, a gate of a fourth transistor T4 are all connected to a third node N3. A gate of the second transistor T2 is connected to its drain. A drain of a third transistor T3, a gate of a fifth transistor T5, a drain of a seventh transistor T7, a gate of a ninth transistor T9, and an terminal of a first capacitor C1 are connected to a first node N1. A source of the fourth transistor T4, a drain of the fifth transistor T5, a gate of a eighth transistor T8 and an terminal of a second capacitor C2 are connected to a second node N2. A drain of the eighth transistor T8 and a source of the ninth transistor T9 are connected to an terminal of the capacitor C1 which is not connected with the node N1.

Also referring to FIG. 2, when the shift register is being driven, a scanning signal STV can be input to a gate of the first transistor T1 and a source of the transistor T3, a high level VGH can be connected to a source of the first transistor T1, a source of the fifth transistor T5 and an terminal of the capacitor C2 which is not connected with the node N2, a low level VGL can be connected to a drain of the fourth transistor T4 and a drain of the second transistor T2, a first clock signal CK1 can be connected with a gate of the first transistor T3, and a second clock signal CK2 can be connected with a gate of the seventh transistor T7. A source of the eighth transistor T8 can be connected with one of CK1 and CK2. The drain of the eighth transistor T8 forms an output terminal Eout of the shift register.

Figure 3:
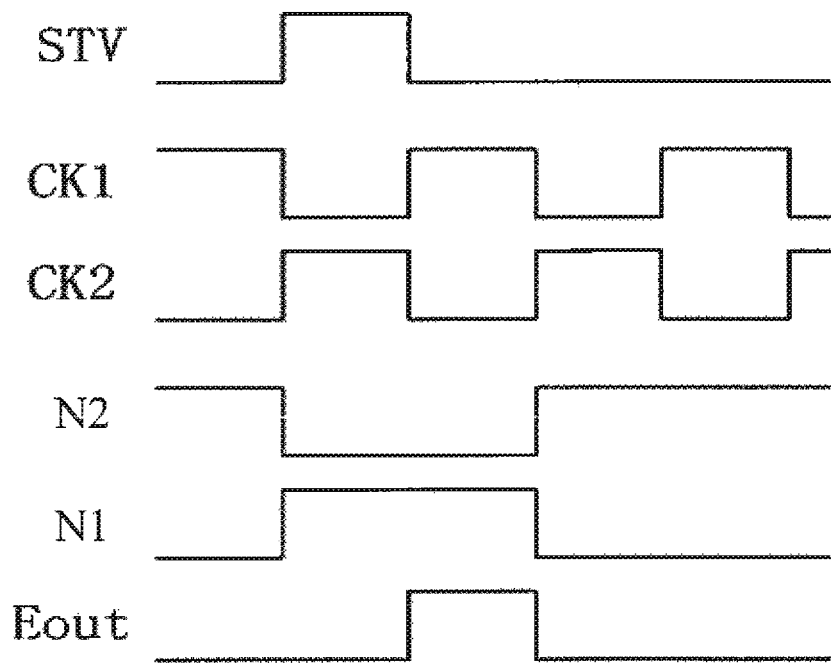
FIG. 3 is a potential diagram of nodes and key signals in the method for driving the shift register in FIG. 2.

When the source of the eighth transistor T8 is input with CK1, a potential diagram of nodes and key signals in the method for driving the shift register in FIG. 2 can be shown as in FIG. 3.

During a first period in which STV is a high level, CK1 is a low level, and CK2 is a high level opposite to CK1. At this time, the third transistor T3 is turned on, and the level at the node N1 is a high level, resulting in the fifth transistor T5 and the ninth transistor T9 being turned off. The first transistor T1 is also turned off. At this time, the node N3 is pulled down to a low level, resulting in the fourth transistor T4 being turned on, so that the level at the node N2 is a low level. At this time, the eighth transistor T8 is turned on, and the Eout (the drain of the eighth transistor T8) outputs a high level signal (a positive pulse signal). Due to the high level of CK2, the seventh transistor T7 is turned off.

During a second period after the first period, STY turns to be a low level, CK1 is a high level, and CK2 is a low level. At this time, the third transistor T3 is turned off, the capacitor C1 maintains a voltage at the node N1 to be a high level, and the fifth transistor T5 is still turned off. On the other hand, the first transistor T1 is turned on, resulting in a level at the node N3 being pulled up, and at this time the forth transistor T4 is turned off. A voltage at the node N2 remains unchanged, and is still a low level. The eighth transistor T8 is still turned on, but because at this time CK2 is a low level, Eout is pulled down to be at a low level. In addition, since the node N2 is at a low level, and CK2 is also a low level, a sixth transistor T6 and a seventh transistor T7 are turned on. At this time, even if the capacitor C1 malfunctions and cannot maintain a level at the node N1 to be a high level, the node N1 will still be pulled up by VGH to ensure the ninth transistor T9 to be turned off. The sixth transistor T6 and the seventh transistor T7 play a role of locking the ninth transistor T9.

So far, the shift register in FIG. 2 has finished shifting the positive-logic signals and outputting them.

During a third period after the second period, STV is a low level, CK1 is a low level, and CK2 is a high level. At this time, the third transistor T3 is turned on, and because STV is a low level, the voltage at the node N1 is pulled down, thus turning on the fifth transistor T5 and the ninth transistor T9 and pulling up the voltage at the node N2. The states of the first transistor T1 and the fourth transistor T4 remain unchanged. Because CK2 is a high level, the node N2 is also at a high level, the sixth transistor T6 and the seventh transistor T7 are both turned off. The operations in the third period amount to finishing resetting the voltages at the respective nodes.

In addition, after the third period, a high level applied on the fifth transistor T5 can be stopped, and due to the presence of the capacitor C2, the node N2 can still be maintained at a high level. The eighth transistor T8 is ensured to be turned off, so that the output terminal Eout will not output a high level again. Providing the capacitor C2 can avoid continuing applying a high voltage on the source of the fifth transistor after output of the positive-logic signals is finished, reducing the power consumption of the shift register. Of course, in the practical application, even if the capacitor C2 is not provided, the above shift register can still realizing shifting the positive-logic signals and outputting them. The implementations of the disclosure should not be understood as a limit to the protection scope of the disclosure.

The advantage of providing the ninth transistor T9 is: even if there is leakage current at the terminal of Eout, it will flow into the low voltage terminal through the ninth transistor T9, instead of outputting a high level signal here, thus well ensuring that no high level signals will be output after the second period. However, in the practical applications, even if the ninth transistor T9 is not provided here, because the node N2 is maintained to be at a high level after the second period, the terminal of Eout will in general not output a high level signal in the case of no leakage. Not providing the ninth transistor T9 does not influence the shift register of the embodiments of the disclosure shifting positive-logic signals and outputting them, and the corresponding implementations should also fall into the protection scope of the disclosure.

In the meantime, it should be noted that the sixth transistor T6 and the seventh transistor T7 in FIG. 2 are not necessary structures neither. In the case that the capacitor C1 can normally maintain the node N1 to be at a high level, the ninth transistor T9 will not turned on during the second period in which positive-logic signals are output, correspondingly not influencing the function of realizing shift output by the shift register of the embodiments of the disclosure.

It should be noted that the terminal of the capacitor C2 which is not connected with the node N2 can be not connected to VGH neither. Accordingly, the terminal of the capacitor C1 which is not connected with the node N1 is not necessary to connected to Eout, neither. The corresponding implementations will not influence practicing the disclosure.

Figure 4:
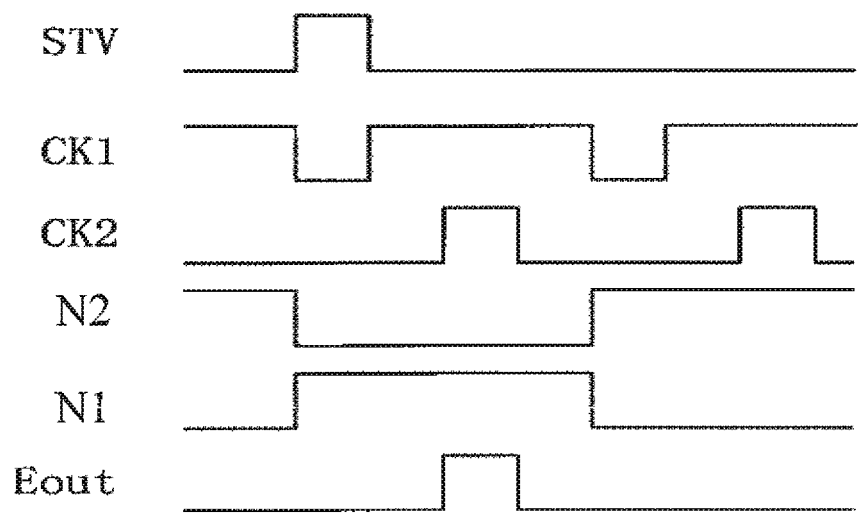
FIG. 4 is another potential diagram of nodes and key signals in the method for driving the shift register in FIG. 2.

When CK2 is input to a gate of the eighth transistor T8, a potential diagram of nodes and key signals in the method for driving the shift register in FIG. 2 can be shown as in FIG. 4.

During a first period in which STV is a high level, CK1 is a low level, and CK2 is also a low level. At this time, the third transistor T3 is turned on, and the level at the node N1 is a high level, resulting in the fifth transistor T5 and the ninth transistor T9 being turned off. The first transistor T1 is also turned off. At this time, the node N3 is pulled down to a low level, resulting in the fourth transistor T4 being turned on, so that the level at the node N2 is a low level. At this time, the eighth transistor T8 is turned on, and the terminal of Eout outputs a low level due to the low level of CK2.

During a second period, CK1 is a high level, and CK2 is still a low level. At this time, the voltages at the node N1 and node N2 remain unchanged, the eighth transistor T8 remains under the turning-on state, and the terminal of Bout still outputs a low level due to the low level of CK2.

During a third period, CK1 is a high level, and CK2 is also a high level. At this time, the voltages at the node N1 and node N2 remain unchanged, and the eighth transistor T8 remains under the turning-on state. But the terminal of Eout still outputs a high level due to the high level of CK2. So far, the shift output of the positive-logic signals has been finished.

During the above operating process in which the shift register is operating, the third transistor T3 realizes an input control over the positive-logic signals, acting as an input switch unit. The eighth transistor T8 realizes an output control over the positive-logic signals, acting as an output switch unit. The first transistor T1, the second transistor T2, the fourth transistor T4 and the fifth transistor T5 collectively make the levels at the node N1 inverted and output, constituting an inverting unit. The ninth transistor T9 plays a function of leakage protection switch, acting as a leakage protection switch unit. The sixth transistor T6 and the seventh transistor T7 play a function of locking the ninth transistor T9, acting as a lock switch unit. The capacitor C1 and the capacitor C2 play a function of maintaining the levels at the node N1 or N2, constituting a voltage maintaining unit.

An embodiment of the disclosure also provides a shift scanning circuit comprising multiple stages of cascaded shift registers in FIG. 2. The shift register further comprises a plurality of clock signal lines. Referring to FIG. 2, in the shift scanning circuit, gates of the third transistors T3 in the respective shift registers are connected to the same clock signal line CK1, the sixth transistors T6 are connected to the clock signal line CK2 different from CK1, the source of the eighth transistor T8 can be connected to CK1 or CK2. The drain of the eighth transistor T8 in the present-stage shift register is connected to the source of the third transistor T3 and the gate of the first transistor Ti in the next-stage shift register, providing input positive-logic signals to the source of the third transistor T3 and the gate of the first transistor T1. It is apparent that the shift scanning circuit can comprise only one clock signal line if the sixth transistor T6 and the seventh transistor T7 are not provided.

Figure 5:
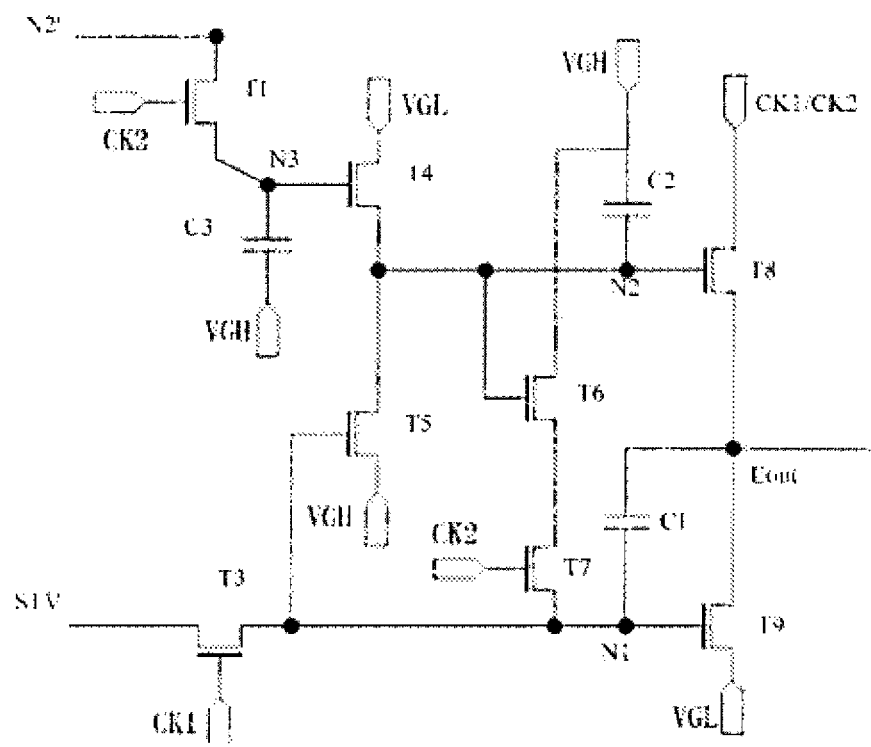
FIG. 5 is a structure schematic diagram of another optional structure of the shift register in FIG. 1.

FIG. 5 is a structure schematic diagram of another optional structure of the shift register in FIG. 1. Different from the shift register in FIG. 2, in FIG. 5, instead of the second transistor T2, a capacitor C3 is connected at the node N3. The other structures and connection relationships are the same.

Figure 6:
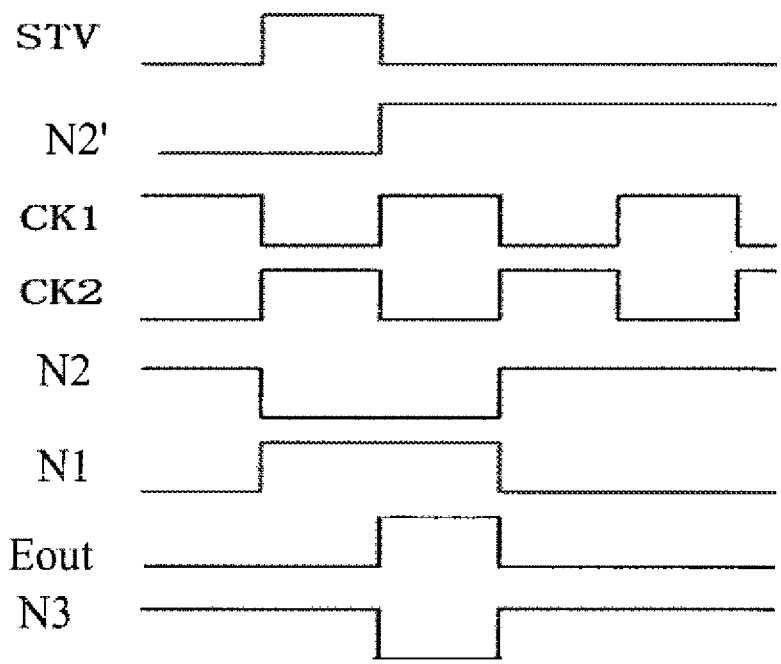
FIG. 6 is a potential diagram of nodes and key signals in the method for driving the shift register in FIG. 5.

At this time, when the shift register in FIG. 5 is driven, CK2 can be applied on the gate of the first transistor T1, and its source is connected to the node N2' of the previous-stage shift register. At this time, a potential diagram of key nodes and key signals applied on the shift register in FIG. 5 can be shown as in FIG. 6, wherein the potentials and timings of the CK1, CK2, node N1, node N2, Eout and STV are identical with FIG. 3. It differs from FIG. 3 in that since the node N2' of the previous-stage shift register is a low level only in the first period and maintains a high level after the first period, the voltage at the node N2' can be introduced to charge the terminal of capacitor C3 which is connected with the node N3 during the second period in which CK2 is a low level. Thus, in the subsequent process, no matter whither the first transistor T1 is turned on or not, the voltage at the node N3 maintains a high level (when the first transistor T1 is turned on, the node N3 is at the same potential as the node N2', both being a high level; when the first transistor T1 is turned off, the voltage at the node N3 maintains a high level). Compared to the way in FIG. 2 which is required to continue outputting a high voltage to the source of the first transistor T1 after the first period so as to maintain a high level at the node N3, it can further reduce the power consumption.

Figure 7:
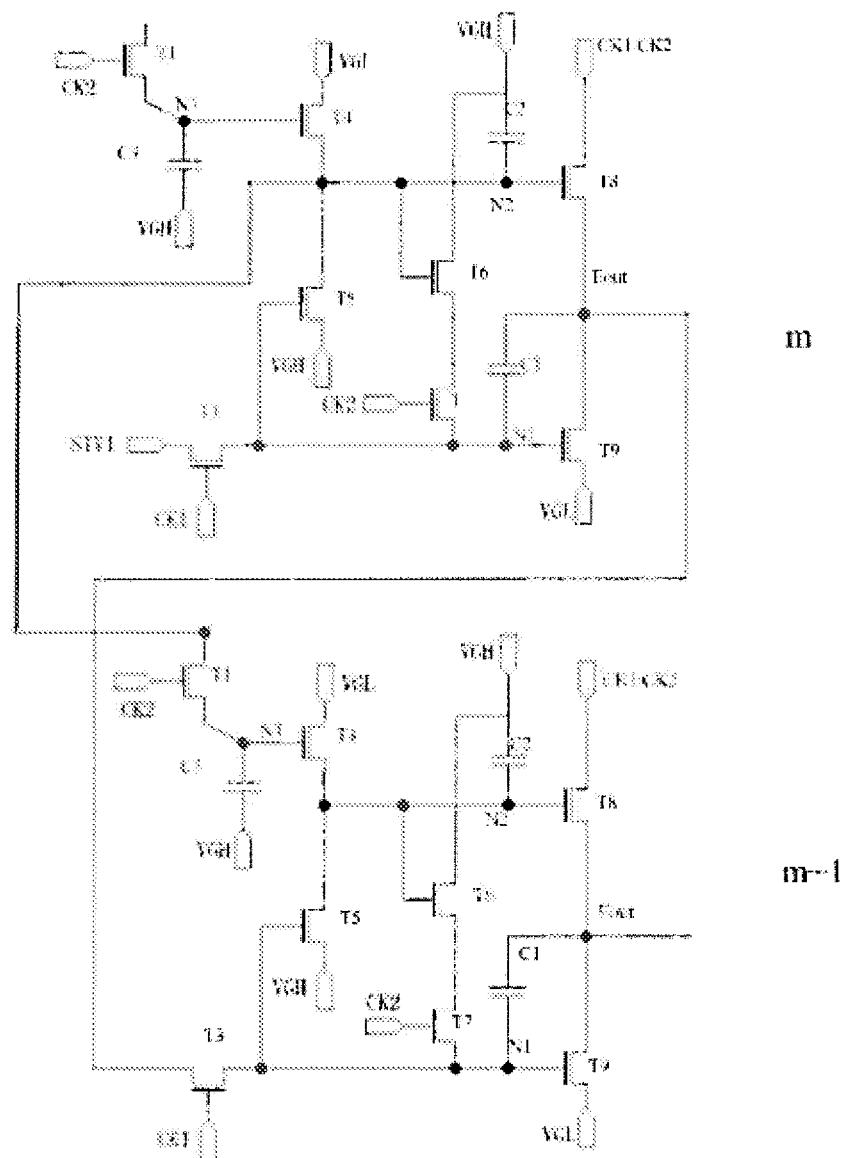
FIG. 7 is a structure schematic diagram of a shift scanning circuit comprising the shift register in FIG. 5.

An embodiment of the disclosure also provides a shift scanning circuit comprising multiple stages of cascaded shift registers in FIG. 5. The shift scanning circuit further comprises at least one clock signal line. FIG. 7 is a structure schematic diagram of two stages, the m-th and the (m+1)-th stage, of the cascaded shift registers, wherein the first transistors T1 of the respective shift registers are connected to the same clock signal line CK2, the gates of the third transistors T3 are connected to the same clock signal line CK1, the sixth transistors T6 are connected to the clock signal line CK2 different from CK1, and the sources of the eighth transistors T8 can be connected to CK1 or CK2. The drain of the eighth transistor T8 in the m-th stage shift register is connected to the source of the third transistor T3 in the (m+1)-th stage shift register, and inputs a positive-logic signal to the source of the third transistor T3. The node N2 in the m-th stage shift register is connected to the source of the first transistor T1 in the (m+1)-th stage shift register.

An embodiment of the disclosure also provides a display apparatus comprising the shift scanning circuit according to any one of the above. The display apparatus can be any products or means with a display function, such as a mobile phone, tablet, TV set, display, portable computer, digital frame, navigator.

The implementations above are only illustrative but not restrictive for the disclosure. The ordinary skilled in the art can make various changes and modifications without departing from the spirit and scope of the disclosure. Therefore, all the equivalent implementations also belong to the scope of the disclosure, and the protection scope of the disclosure should be defined by the appended claims.

The present application claims the priority of a Chinese patent application No. 201410759198.1 filed on Dec. 10, 2014, and the content disclosed by the Chinese patent application is incorporated herein in full by reference as a part of the application.

What is claimed is:

1. A shift register comprising an input switch unit, an inverting unit, an output switch unit and a first node voltage maintaining unit, wherein
   the input switch unit has an output terminal connected to a first node, and is turned on according to a control signal applied on its control terminal;
   the first node voltage maintaining unit has a voltage stabilizing terminal connected to the first node, and is adapted to record a level at the first node when the input switch unit is turned on, and to maintain the recorded level at an input terminal of the inverting unit when the input switch unit is turned off;
   the inverting unit has an output terminal connected to a second node, and is adapted to make the level at the first node inverted and output to the second node, in response to the control signal input at its control terminal;
   the output switch unit has a control terminal connected to the second node, and is turned on according to a state of a level at the second node.

2. The shift register according to claim 1, further comprising a leakage protection switch unit, wherein the leakage protection switch unit has an input terminal connected to an output terminal of the output switch unit and a control terminal connected to the first node, and is turned on according to a state of the level at the first node.

3. The shift register according to claim 2, further comprising a first lock switch unit and a second lock switch unit, the first lock switch unit and the second lock switch unit being turned on according to states of levels at their control terminals, wherein
   the first lock switch unit has an output terminal connected to an input terminal of the second lock switch unit and an control terminal connected to the second node; and
   the second lock switch unit has an output terminal connected to the first node.

4. The shift register according to claim 1, further comprising a second node voltage maintaining unit, wherein the second node voltage maintaining unit has a voltage stabilizing terminal connected to the second node, and is adapted to record the level at the first node when the inverting unit is operating, and to maintain the recorded level at the second node when the inverting unit stops operating.

5. The shift register according to claim 1, wherein the inverting unit comprises a first inverting switch unit, a second inverting switch unit, a third inverting switch unit and a third node voltage maintaining unit, wherein the respective inverting switch units are all turned on according to states of levels at their control terminals, and the control terminal of the inverting unit is a control terminal of the first inverting switch unit;
 an output terminal of the first inverting switch unit and a control terminal of the second inverting switch unit are connected to a third node, an output terminal of the second inverting switch unit is connected to an input terminal of the third inverting switch unit and the second node, and an output terminal of the third inverting switch unit is connected to the first node; and
 the third node voltage maintaining unit has a voltage stabilizing terminal connected to the third node, and is adapted to record a level at the third node when the first inverting switch unit is turned on, and to maintain the recorded level at the third node when the first inverting switch unit is turned off.

6. The shift register according to claim 1, wherein the inverting unit comprises a first inverting switch unit, a second inverting switch unit, a third inverting switch unit and a fourth inverting switch unit, wherein the respective inverting switch units are all turned on according to states of levels at their control terminals, and the control terminal of the inverting unit is a control terminal of the first inverting switch unit; and wherein
 an output terminal of the first inverting switch unit, a control terminal of the second inverting switch unit and an input terminal of the fourth inverting switch unit are connected to a third node, an output terminal of the second inverting switch unit is connected to an input terminal of the third inverting switch unit and the second node, and an output terminal of the third inverting switch unit is connected to the first node.

7. The shift register according to claim 1, wherein the respective switch units are all P-channel type transistors and voltage stabilizing units are capacitors.

8. A shift scanning circuit comprising a plurality of cascaded shift registers according to claim 1.

9. The shift scanning circuit according to claim 8, further comprising at least one clock signal line, wherein, in respective shift registers, the control terminals of the input switch units are connected to the same clock signal line, and the input terminals of the output switch units are connected to the same clock signal line, and the input terminal of the input switch unit in the present-stage shift register is connected to the output terminal in a previous-stage shift register.

10. The shift scanning circuit according to claim 9, wherein the inverting unit in the respective shift registers comprises a first inverting switch unit, a second inverting switch unit, a third inverting switch unit and a third node voltage maintaining unit, wherein
 the respective inverting switch units are all turned on according to states of levels at their control terminals, and the control terminal of the inverting unit is a control terminal of the first inverting switch unit,
 an output terminal of the first inverting switch unit and a control terminal of the second inverting switch unit are connected to a third node, an output terminal of the second inverting switch unit is connected to an input terminal of the third inverting switch unit and the second node, and an output terminal of the third inverting switch unit is connected to the first node,
 the third node voltage maintaining unit has a voltage stabilizing terminal connected to the third node, and is adapted to record a level at the third node when the first inverting switch unit is turned on, and to maintain the recorded level at the third node when the first inverting switch unit is turned off; and
 the control terminals of the first inverting switch units in the respective shift registers are connected to the same clock signal line, and the clock signal line is different from the one connected to the control terminals of the input switch units.

11. The shift scanning circuit according to claim 9, wherein the inverting unit in the respective shift registers comprises a first inverting switch unit, a second inverting switch unit, a third inverting switch unit and a fourth inverting switch unit, wherein
 the respective inverting switch units are all turned on according to states of levels at their control terminals, and the control terminal of the inverting unit is a control terminal of the first inverting switch unit,
 an output terminal of the first inverting switch unit, a control terminal of the second inverting switch unit and an input terminal of the fourth inverting switch unit are connected to a third node, an output terminal of the second inverting switch unit is connected to an input terminal of the third inverting switch unit and the second node, and an output terminal of the third inverting switch unit is connected to the first node; and
 the control terminal of the first inverting switch unit in the present-stage shift register is connected to an output terminal in the previous-stage shift register, and the input terminal is connected to the second node in the previous-stage shift register.

12. The shift scanning circuit according to claim 9, wherein the inverting unit in the respective shift registers comprises a leakage protection switch unit, a first lock switch unit and a second lock switch unit, the first lock switch unit and the second lock switch unit being turned on according to states of levels at their control terminals, wherein
 the leakage protection switch unit has an input terminal connected to an output terminal of the output switch unit and a control terminal connected to the first node, and is turned on according to a state of the level at the first node,
 the first lock switch unit has an output terminal connected to an input terminal of the second lock switch unit and an control terminal connected to the second node,
 the second lock switch unit has an output terminal connected to the first node; and
 the control terminals of the second lock switch units in the respective shift registers are connected to the same clock signal line, and the clock signal line is different from the one connected to the control terminals of the input switch units.

13. The shift scanning circuit according to claim 9, wherein the clock signal line connected to the input terminals of the output switch units is the same with the one connected to the control terminals of the input switch units.

14. A driving method of a shift register, for driving the shift register according to claim 1, the method comprising:
 applying a control signal on a control terminal of the input switch unit so that the input switch unit is turned on during a first clock period and is turned off during a second clock period, wherein the first clock period is a clock period during which a high level signal is input to an input terminal of the input switch unit;
 applying a control signal on a control terminal of an inverting unit so that the inverting unit makes a voltage at the first node inverted and output to the second node during the first clock period and the second clock period; and applying a high level signal on an input terminal of an output switch unit during one clock period of the first clock period and the second clock period, and applying a low level signal during the other clock period.

15. A display apparatus comprising the shift scanning circuit according to claim 8.

16. The shift register according to claim 2, wherein the respective switch units are all P-channel type transistors and voltage stabilizing units are capacitors.

17. A shift scanning circuit comprising a plurality of cascaded shift registers according to claim 2.

18. The shift scanning circuit according to claim 17, further comprising at least one clock signal line, wherein, in respective shift registers, the control terminals of the input switch units are connected to the same clock signal line, and the input terminals of the output switch units are connected to the same clock signal line, and the input terminal of the input switch unit in the present-stage shift register is connected to the output terminal in a previous-stage shift register.

19. A driving method of a shift register, for driving the shift register according to claim 2, the method comprising:

applying a control signal on a control terminal of the input switch unit so that the input switch unit is turned on during a first clock period and is turned off during a second clock period, wherein the first clock period is a clock period during which a high level signal is input to an input terminal of the input switch unit;

applying a control signal on a control terminal of an inverting unit so that the inverting unit makes a voltage at the first node inverted and output to the second node during the first clock, period and the second clock period; and applying a high level signal on an input terminal of an output switch unit during one clock period of the first clock period and the second clock period, and applying a low level signal during the other clock period.

20. A display apparatus comprising the shift scanning circuit according to claim 17.

* * * * *